United States Patent
Huo et al.

(10) Patent No.: US 9,214,547 B2
(45) Date of Patent: *Dec. 15, 2015

(54) INSULATED GATE BIPOLAR TRANSISTOR STRUCTURE HAVING LOW SUBSTRATE LEAKAGE

(71) Applicant: TAIWAN SEMICONDUCTOR MANUFACTURING COMPANY, LTD., Hsinchu (TW)

(72) Inventors: Ker Hsiao Huo, Taichung (TW); Chih-Chang Cheng, Hsinchu (TW); Ru-Yi Su, Kouhu Township (TW); Jen-Hao Yeh, Kaohsiung (TW); Fu-Chih Yang, Fengshan (TW); Chun Lin Tsai, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/051,655

(22) Filed: Oct. 11, 2013

(65) Prior Publication Data

US 2014/0035035 A1    Feb. 6, 2014

Related U.S. Application Data

(62) Division of application No. 13/372,037, filed on Feb. 13, 2012, now Pat. No. 8,575,694.

(51) Int. Cl.
  *H01L 29/66*    (2006.01)
  *H01L 29/78*    (2006.01)
  *H01L 21/265*   (2006.01)
  *H01L 21/762*   (2006.01)

(Continued)

(52) U.S. Cl.
  CPC ...... *H01L 29/7816* (2013.01); *H01L 21/26533* (2013.01); *H01L 21/76243* (2013.01); *H01L 21/76283* (2013.01); *H01L 29/1095* (2013.01); *H01L 29/66681* (2013.01); *H01L 29/7824* (2013.01); *H01L 29/063* (2013.01); *H01L 29/1087* (2013.01); *H01L 29/42368* (2013.01); *H01L 2924/0002* (2013.01)

(58) Field of Classification Search
  None
  See application file for complete search history.

(56) References Cited

U.S. PATENT DOCUMENTS 8,575,694 B2 * 11/2013 Huo et al. .......... 257/339
2002/0098664 A1 * 7/2002 Fang ............... 438/480

(Continued)

OTHER PUBLICATIONS

Bertrand, I., et al., New Lateral DMOS and IGBT Structures Realized on a Partial SOI Substrate Based on Lego Process', IEEE BCTM 5.2, 2005, pp. 74-77.

(Continued)

*Primary Examiner* — Robert Bachner
(74) *Attorney, Agent, or Firm* — Haynes and Boone LLP

(57) ABSTRACT

A high voltage metal-oxide-semiconductor laterally diffused device (HV LDMOS), particularly an insulated gate bipolar junction transistor (IGBT), and a method of making it are provided in this disclosure. The device includes a semiconductor substrate, a gate structure formed on the substrate, a source and a drain formed in the substrate on either side of the gate structure, a first doped well formed in the substrate, and a second doped well formed in the first well. The gate, source, second doped well, a portion of the first well, and a portion of the drain structure are surrounded by a deep trench isolation feature and an implanted oxygen layer in the silicon substrate.

20 Claims, 16 Drawing Sheets

(51) Int. Cl.
*H01L 29/423* (2006.01)
*H01L 29/06* (2006.01)
*H01L 29/10* (2006.01)

(56) References Cited

U.S. PATENT DOCUMENTS

| | | |
|---|---|---|
| 2004/0262680 A1 | 12/2004 | Ehwald |
| 2007/0090451 A1 | 4/2007 | Lee |
| 2007/0207600 A1* | 9/2007 | You et al. .................. 438/527 |
| 2008/0173943 A1* | 7/2008 | Kang ........................... 257/347 |
| 2008/0293202 A1* | 11/2008 | Shiraki et al. ................ 438/270 |
| 2010/0032755 A1* | 2/2010 | Benaissa et al. ............. 257/337 |
| 2010/0295124 A1 | 11/2010 | Lerner |
| 2011/0227130 A1* | 9/2011 | Liu et al. ...................... 257/183 |
| 2011/0241114 A1* | 10/2011 | Su et al. ....................... 257/343 |

OTHER PUBLICATIONS

Hardikar, Shyam, et al., "Transient Substrate Currents in Junction-Isolated Lateral IGBT", IEEE Transactions on Electron Devices, vol. 53, No. 6, Jun. 2006, pp. 1487-1490.

* cited by examiner

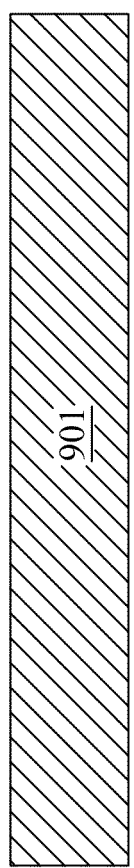 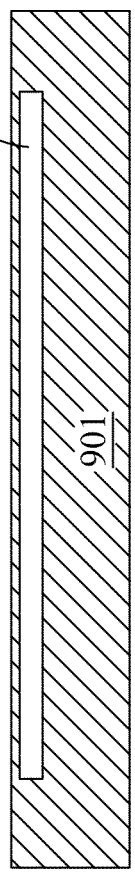 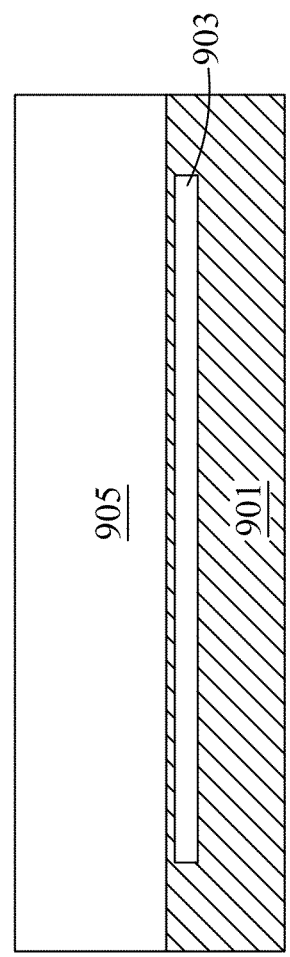

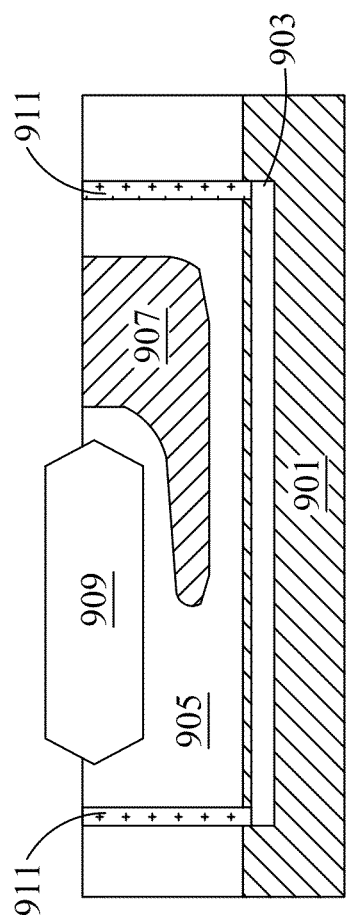

INSULATED GATE BIPOLAR TRANSISTOR STRUCTURE HAVING LOW SUBSTRATE LEAKAGE

PRIORITY CLAIM

The present application is a divisional of U.S. application Ser. No. 13/372,037, filed Feb. 13, 2012, the disclosure of which is incorporated by reference herein in its entirety.

FIELD

The present disclosure relates generally to semiconductor technology, and more particularly, to high voltage semiconductor devices and methods of making the same.

BACKGROUND

Technological advances in semiconductor integrated circuit (IC) materials, design, processing, and manufacturing have enabled ever-shrinking IC devices, where each generation has smaller and more complex circuits than the previous generation.

As semiconductor circuits composed of devices such as metal-oxide-semiconductor field effect transistors (MOSFETs) are adapted for high voltage applications, such as high voltage lateral diffusion metal-oxide-semiconductor devices (HV LDMOSs) including high voltage insulated gate bipolar transistors (HV IGBTs), problems arise with respect to decreasing voltage performance as the scaling continues with advanced technologies. To prevent punch-through between source and drain, or to reduce resistance of source and drain, standard MOS fabrication process flows may be accompanied by multiple implantations of high concentrations. Substantial substrate leakage and voltage breakdown often occurs with device reliability degradation.

Performance of a HV MOS transistor is often limited by its substrate leakage and breakdown voltage (BV) threshold. Substantial substrate leakage reduces switching speed and increases likelihood of unwanted latch-up. Full or partial use of silicon-on-insulator (SOI) substrates has been developed to reduce substrate leakage. Use of full SOI substrates is expensive and results in low BV threshold. Use of partial SOI substrates results in improved BV threshold, but is difficult and even more expensive to make.

Therefore, a HV LDMOS device having a low substrate leakage and a high breakdown voltage threshold and a method for making the same in a cost effective manner continues to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 9A to 9H are cross sections of a workpiece corresponding to HV LDMOS device embodiment of the present disclosure in various stages of manufacturing according to method embodiments of the present disclosure.

Figure 1A:
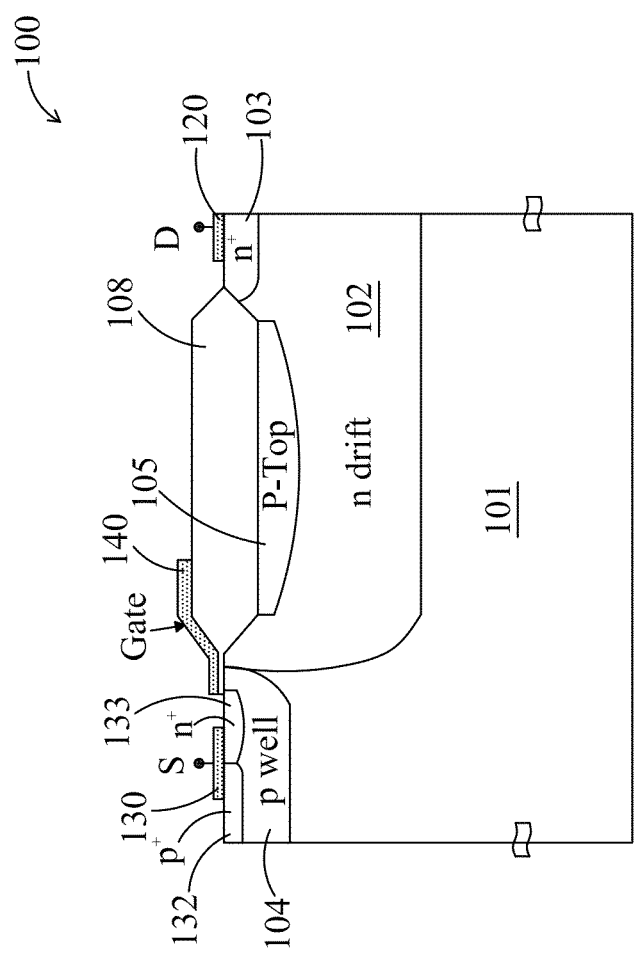
FIGS. 1A and 1B are cross-sectional views of two types of conventional high voltage lateral diffusion metal oxide semiconductor (HV LDMOS) transistor devices.

Various embodiments of the present invention will be explained in detail with reference to the accompanying drawings.

DETAILED DESCRIPTION

The present disclosure relates to semiconductor high voltage lateral diffusion metal oxide semiconductor (HV LDMOS) transistors having low substrate leakage and high breakdown voltage thresholds and a method for fabricating such devices. It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Spatially relative terms, such as "beneath," "below," "lower," "above," "upper", "over" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may likewise be interpreted accordingly.

FIG. 1A is a cross-sectional view of a conventional HV LDMOS transistor. In FIG. 1A, an n-type HV MOS device 100 is fabricated in a p-substrate 101. A deep n-well (n-drift) 102 is formed in the substrate 101. A field oxide 108 is formed over the n-well 102 and a gate 140 is partly overlying the field oxide 108. A source and a drain are formed on opposite sides of the gate 140. The source includes a pair of oppositely doped regions p+ (132) and n+ (133) contained in a p-well 104. Source terminal 130 is electrically connected to the source regions 132 and 133. On one side of gate 140 and at the edge of field oxide 108, n+ doped drain region 120 is formed in n-well 102 and electrically connected to a drain terminal 120. A p-top region 105 is formed between field oxide 108 and the deep implanted n-drift region 102. The p-top region 105 is a floating layer and is not connected to the source or the drain region.

Figure 1B:
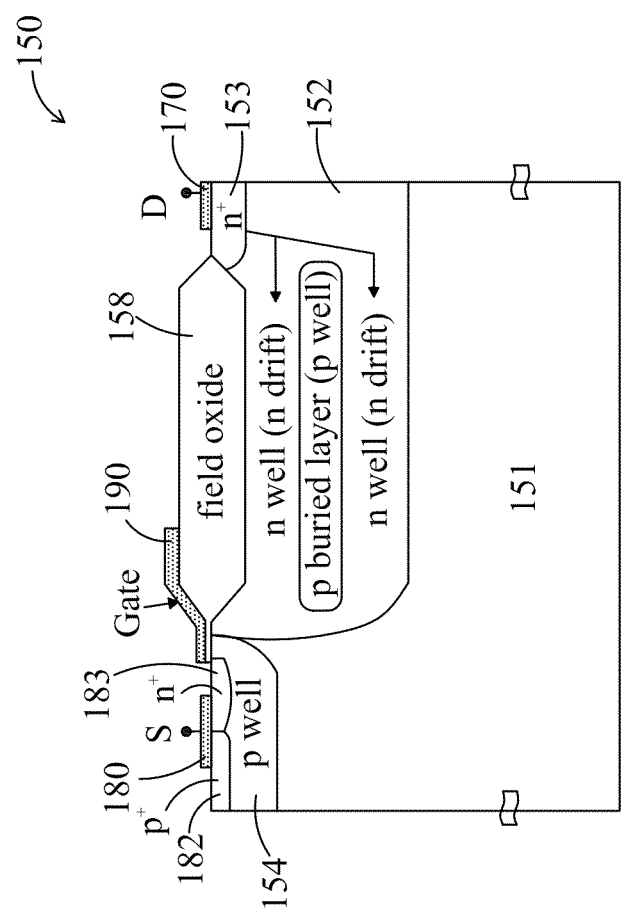

FIG. 1B is a cross-sectional view of another conventional HV LDMOS device 150. Unlike device 100 in FIG. 1A, device 150 has the p-top layer replaced by a buried p-well 155. In FIG. 1B, an n-type HV LDMOS device 150 is fabricated in a p-substrate 151. A deep n-well (n-drift) 152 is formed in the substrate 151. A field oxide 158 is formed on the n-well 152 and a gate 190 is partly overlying the field oxide 158. A source and a drain are formed on either side of the gate 190. The source includes a p-type region p+ (182) and an n-type region N+ (183), both contained in a p-well 154. Source terminal 180 is electrically connected to source regions 182 and 183. On the opposite side of gate 190 and at the edge of field oxide 158, n+ doped drain region 153 is formed in n-well 152 and is electrically connected to a drain terminal 170. A deep implanted region p-well 155 is formed in the middle of the deep implanted n-drift region 152 and is also under but not connected to field oxide 158. The buried p-well region 155 is a floating layer and is not connected to the source or the drain region.

Figure 2A:
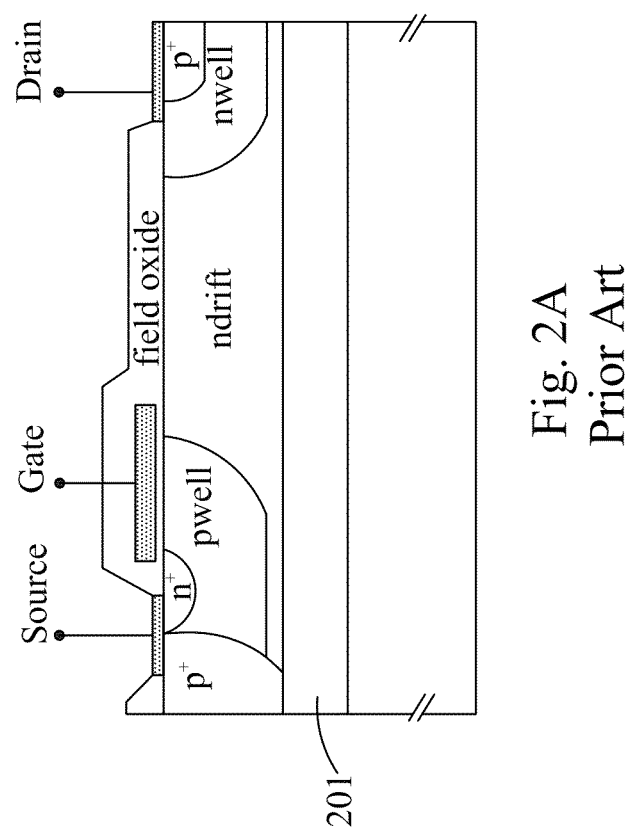
FIGS. 2A and 2B are cross-sectional views of two types of conventional HV LDMOS transistor devices employing silicon-on-insulator (SOI) substrates.

In order to address the substantial substrate leakage current of the conventional HV LDMOS transistors of FIGS. 1A and 1B, an HV LDMOS transistor formed on a silicon-on-insulator (SOI) substrate is developed as shown in FIG. 2A. The HV LDMOS structure is formed over an SOI substrate including a buried oxide (BOX) layer 201. During operation, the BOX layer 201 limits the substrate leakage current. However, the HV LDMOS of FIG. 2A results in a very low breakdown voltage (BV) threshold (about ⅓ of the convention HV LDMOS of FIGS. 1A and 1B) because the BOX layer 201 prevents the spread of a depletion region into the substrate by forming a layer of mobile charge under the BOX layer 201.

Figure 2B:
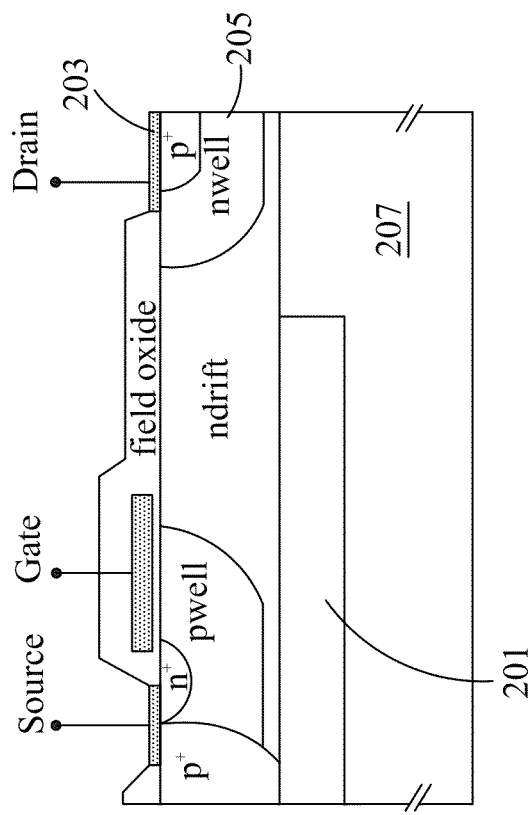

A partial SOI device of FIG. 2B is developed to increase the BV threshold. In FIG. 2A, the BOX layer 201 does not extend under the entire device. A portion of the BOX layer 201 is removed and the substrate material re-formed under the drain structure 203 and the n-well 205. In this partial SOI device, a voltage applied between the drain and the substrate is supported across the BOX layer 201 and the depletion layer into the substrate, which significantly improves the device BV threshold. However, the partial SOI device is difficult and very expensive to make. One method of forming the partial SOI substrate involves etching through the p-substrate 207 from the backside to remove a portion of the BOX layer 201 while leaving the substrate material on the front side intact, then epitaxially growing the substrate material back. Because the thickness of p-substrate, the amount of material to etch and regrow is very large compared to typical semiconductor processes and increases the cost of an SOI wafer, this method is difficult to implement for mass-manufacturing. Another method of forming the partial SOI substrate involves etching a portion of the BOX layer from the front side, depositing polysilicon over the BOX layer portions, and growing the monocrystalline substrate around the BOX layer and the polysilicon. An anneal process then melts the polycrystalline areas while maintaining the structure in monocrystalline areas. A thermal gradient is then induced to allow recrystallization across the polycrystalline area into a monocrystalline structure. This process results in a non-planar top surface above the BOX layer which must then be planarized before further epitaxial process can proceed. Just as the backside etch and regrowth method, this method is expensive and difficult to implement for mass-manufacturing.

Figure 3:
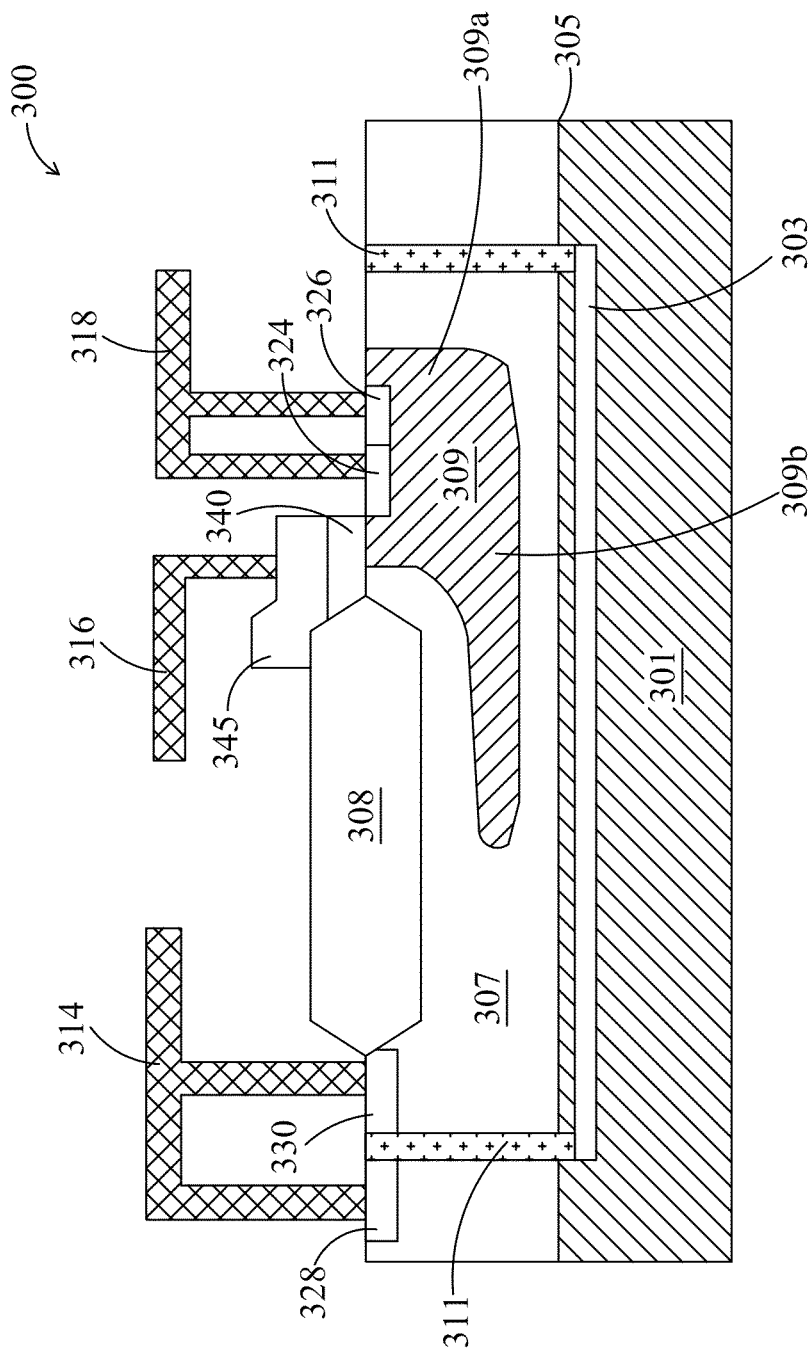
FIG. 3 is a cross-sectional view of a HV LDMOS transistor according to various embodiments of the present disclosure.

FIG. 3 shows a cross-sectional view of a HV LDMOS transistor 300 according to various embodiments of the present disclosure. The HV LDMOS of FIG. 3 is a transistor having low substrate leakage and good BV threshold without using expensive SOI substrates and difficult-to-implement processes. The HV LDMOS 300 may be a high voltage insulated gate bipolar transistors (HV IGBT). In FIG. 3, a lightly doped substrate 301 having a first type of conductivity is provided. In the present embodiment, the HV LDMOS transistor 300 is an n-type HV LDMOS, and thus, the substrate 301 includes a p-type silicon substrate (p-substrate). The substrate be a semiconductor wafer, such as a silicon wafer. Alternatively or additionally, the substrate may include other semiconductors, such as germanium, silicon carbide, gallium arsenic, indium arsenide, and indium phosphide. The substrate may include an alloy semiconductor, such as silicon germanium, silicon germanium carbide, gallium arsenic phosphide, and gallium indium phosphide.

A process such as separation by implanted oxygen (SIMOX) is used to create an implanted oxygen layer 303 below a top surface 305 of the substrate 301. The implanted oxygen layer 303 does not affect the planarity of the top surface 305 of the substrate 301. A first well 307 is formed over the substrate 301, the first well having a different type of conductivity from the substrate. For example, the substrate has a p-type conductivity and the first well has an n-type conductivity. In the present embodiment, the first well 307 is an N-Drift (n-well) formed over the p-substrate 301 by an epitaxial process using a dopant.

A second well 309 is formed in the first well 307, the second well 309 having the same type of conductivity as the substrate 301. The second well 309 may be referred to as a P-body. The second well 309 may have different portions, each portion having a different location and depth in the first well 307 from the other portions. The two portions are formed in separate doping processes. For example, shown in FIG. 3, the second well P-Body 309 has a portion 309a, which surrounds source regions 324 and 326, and another portion 309b, which extends out from the portion 309a in a direction towards the drain structure 328 and 330. Portion 309a and portion 309b of the P-Body are attached. The N-Drift 307 has an n-type dopant such as phosphorus, and the P-Body 309 have a p-type dopant such as boron. In one embodiment, the N-Drift 307 and P-Body 309 may be formed by a plurality of processing steps, whether now known or to be developed, such as growing a sacrificial oxide on the substrate, opening a pattern for the location(s) of the P-Body regions 309a and 309b or N-Drift 307, and implanting the impurities.

A field insulating layer 308 is formed on the substrate. A gate structure 345 and 340 has a first portion overlying the first well N-Drift 307 and a second portion overlying the second well P-Body 309. The gate structure includes a gate dielectric 340 and a gate electrode 345 formed on the gate dielectric 340. The gate dielectric 340 may include a silicon oxide layer suitable for high voltage applications. Alternatively, the gate dielectric 340 may optionally include a high-k dielectric material, silicon oxynitride, other suitable materials, or combinations thereof. The high-k material is selected from metal oxides, metal nitrides, metal silicates, transition metal-oxides, transition metal-nitrides, transition metal-silicates, oxynitrides of metals, metal aluminates, zirconium silicate, zirconium aluminate, hafnium oxide, or combinations thereof. The gate dielectric 340 may have a multilayer structure, such as one layer of silicon oxide and another layer of high-k material. The gate dielectric 340 may be formed using chemical vapor deposition (CVD), physical vapor deposition (PVD), atomic layer deposition (ALD), thermal oxide, other suitable processes, or combinations thereof.

The gate electrode 345 is coupled to metal interconnects 316 and disposed overlying the gate dielectric 340. In some embodiments, the gate electrode 345 includes a doped or non-doped polycrystalline silicon (or polysilicon). Alternatively, the gate electrode layer 345 include a metal, such as Al, Cu, W, Ti, Ta, TiN, TaN, NiSi, CoSi, other suitable conductive materials, or combinations thereof. The gate electrode layer 345 are formed by CVD, PVD, ALD, plating, or other processes. The gate electrode layer may have a multilayer structure and may be formed in a multiple-step process.

A drain structure 328 and 330 is formed in the first well N-drift 307 and connected to drain interconnect 314 from above. The drain structure 328 and 330 are located across the field oxide 308 from the gate structure 340 and 345. A source structure 324 and 326 is formed in the top surface of an upper portion 309a of the second well P-Body 309, across the gate structure 340 and 345 from the drain structure 328 and 330. In some embodiments, the source has two oppositely doped regions 324 and 326, both formed in the top surface of the upper portion 309a of the second well P-Body 309 and both connected to source interconnect 318 from above. A first region of the source 326 and the drain structure 330 may have the first type of conductivity, which is the same as that of the substrate 301. A second region of the source 324 and the drain structure 328 may have the second type of conductivity, which is the same as the first well 307. For example in FIG. 3, the first region of the source 324 and the drain structure 328 include n-type dopants, such as phosphorous or arsenic, and the second region of the source 326 and the drain structure 330 include p-type dopants, such as boron. The source structure and drain structure may be formed by a method, such as ion implantation or diffusion. A rapid thermal annealing (RTA) process may be used to activate the implanted dopants.

A deep trench isolation (DTI) 311 laterally surrounds the gate structure 340 and 345, the source structure 324 and 326, the second well P-body 309, the field oxide 308, and the drain structure 330 in the first well 307. Note that the drain structure 328 is not surrounded by the DTI 311. The DTI feature connects to the implanted oxygen layer 303 to pocket certain features of HV LDMOS 300 within insulating materials DTI 311 and implanted oxygen layer 303. The DTI feature 311 is a dielectric material. In certain embodiments, the DTI feature 311 is about 100 nm or more wide. The DTI feature 311 may include a thermally grown silicon oxide layer formed on sidewalls of a trench and the trench filled with thermally grown or deposited silicon oxide. For example, the DTI 311 may be filled with silicon oxide from a CVD process such as high density plasma (HDP) CVD.

Figure 4:
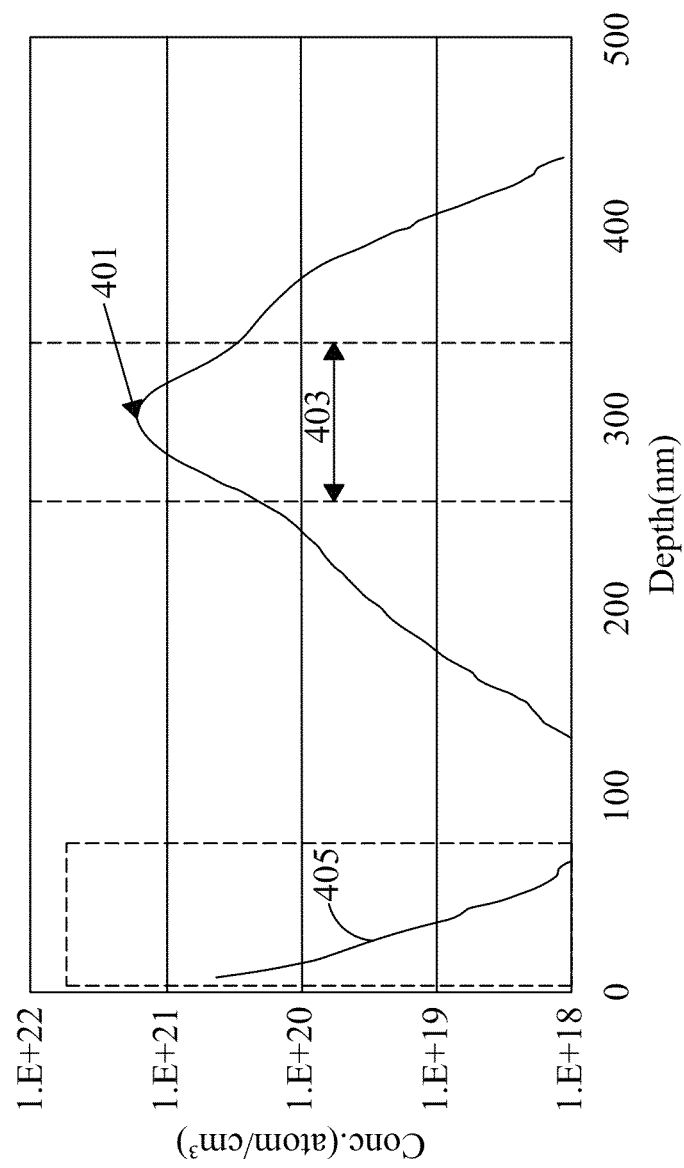
FIG. 4 is an oxygen implant profile of the implanted oxygen layer in the HV LDMOS transistor according to various embodiments of the present disclosure.

FIG. 4 is an oxygen implant profile of the implanted oxygen layer 303 in the substrate 301. As measured from the top surface 305 of the substrate 301, the implanted oxygen layer 303 has an oxygen concentration distribution with a peak oxygen concentration 401 at about 300 nm, or between about 200 nm to 400 nm from the top surface 305. A thickness 403 of the implanted layer 303 defined as a portion below the top surface with oxygen concentration above a predetermined amount. For example, the implanted layer thickness may be about 100 nm with oxygen concentration above about 5E20. The implanted layer is at least 100 nm below the top surface 305, and may be between about 150 nm to about 450 nm. Depending on the implant energy and duration, the implanted layer may be made thinner or thicker. Note that portion 405 of the implant profile near the top surface at about 0 to about 75 nm is surface noise and does not reflect the implanted oxygen concentration.

Figure 5:
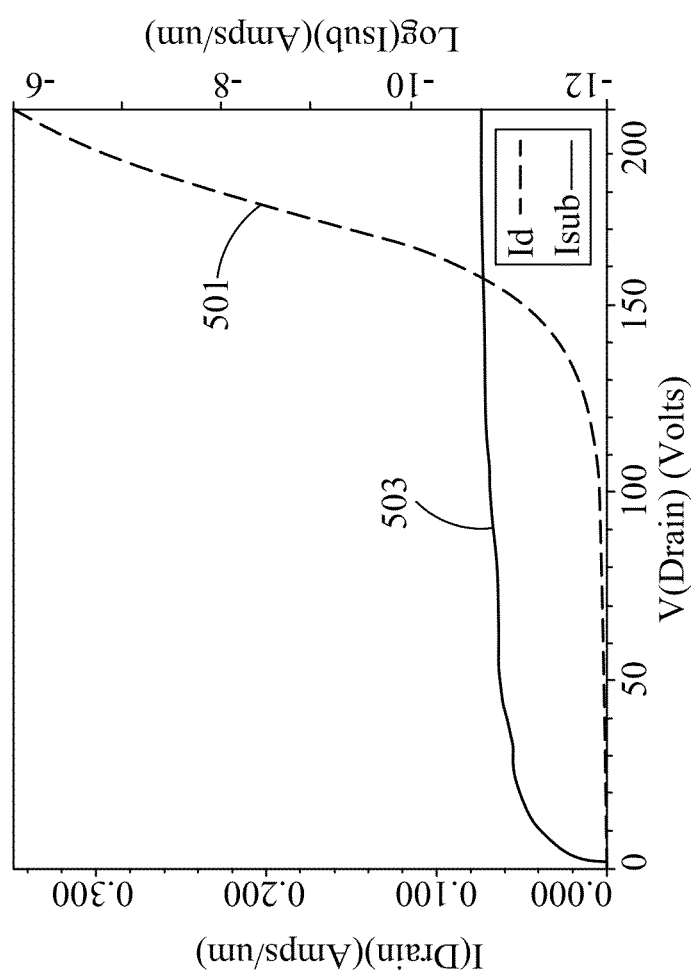
FIG. 5 is a plot of a drain current versus a drain voltage during the transistor operation for the HV LDMOS transistor according to various embodiments of the present disclosure.

FIG. 5 is a plot of current versus drain voltage during the transistor operation when the gate voltage is 20 volts. In other words, the transistor is turned on for conduction between the source and the drain. Line 501 is the drain current in amps per micrometer versus drain voltage. Line 501 shows a normal operation of the transistor where the drain current increases as the drain voltage increases. The current increase is almost linear during the high voltage operation regions of about 150 volts to about 200 volts at the drain. Line 503 shows the substrate current in a log scale in amps per micrometer during the same operation. While the substrate current, in other words, the undesirable substrate leakage current, increases slightly over the operating range of the drain voltages, it is kept below about 2 Log-11 at all times. Line 503 shows negligible substrate leakage during the transistor operation. Thus, minimal current escapes the transistor of the present disclosure during operation such that reduced power and reduced likelihood of latch-up and other undesirable phenomenon would occur.

Figure 6:
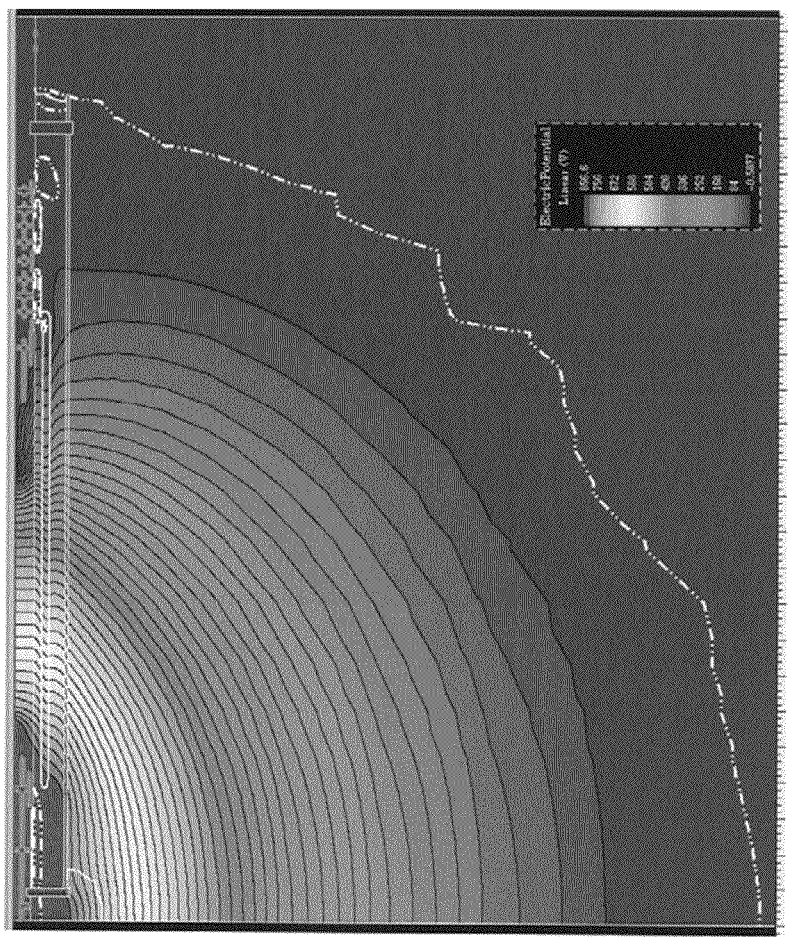
FIG. 6 is an electrical potential diagram modeled for the HV LDMOS transistor according to various embodiments of the present disclosure.

FIG. 6 is an electrical potential diagram modeled for the HV LDMOS transistor 300 when a high voltage of 856.6 volts is applied to the drain (top left of FIG. 6). Because of the drain being separated into portions 328 and 330, the high voltage potential spreads across the substrate instead of being confined within the pocket of DTI 311 and implanted oxygen layer 303. The use of drain structure 328 allows the HV LDMOS transistor 300 to have a much higher breakdown voltage because the potential lines spread into the silicon substrate.

Figure 7:
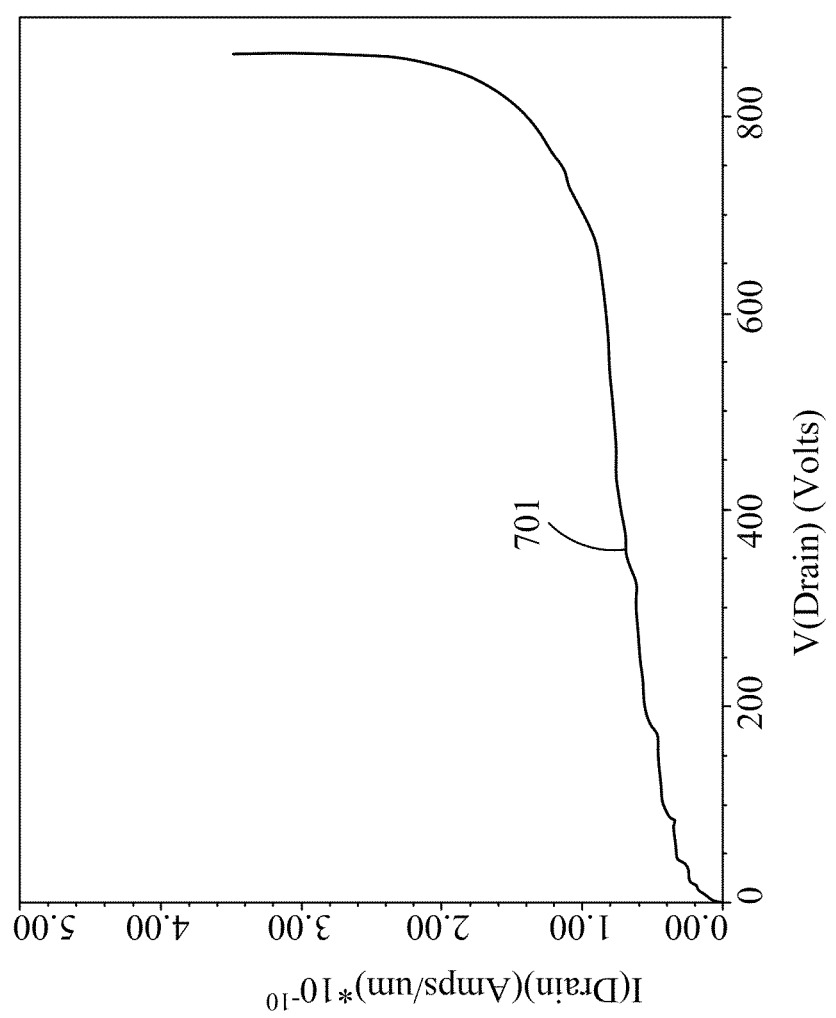
FIG. 7 is a plot of a drain current versus a drain voltage when the transistor is in an off state according to various embodiments of the present disclosure.

FIG. 7 shows the drain current versus a drain voltage with a gate voltage of 5 volts when the transistor is in an off state. The resistance between the source and drain is about 40 mega ohms per centimeter squared. Line 701 shows the drain current in E-10 amps per micrometer. The drain current increased slightly until over 800 volts is applied and breakdown threshold is indicated at 862 volts. This breakdown threshold is much higher than a transistor that does not include the separated drain structure 328, for example, as compared to the transistor of FIG. 2A that has a reported breakdown voltage of 163 volts. This breakdown voltage is also higher than the partial SOI transistor of FIG. 2B that has a reported breakdown voltage of 499 volts.

Figure 8:
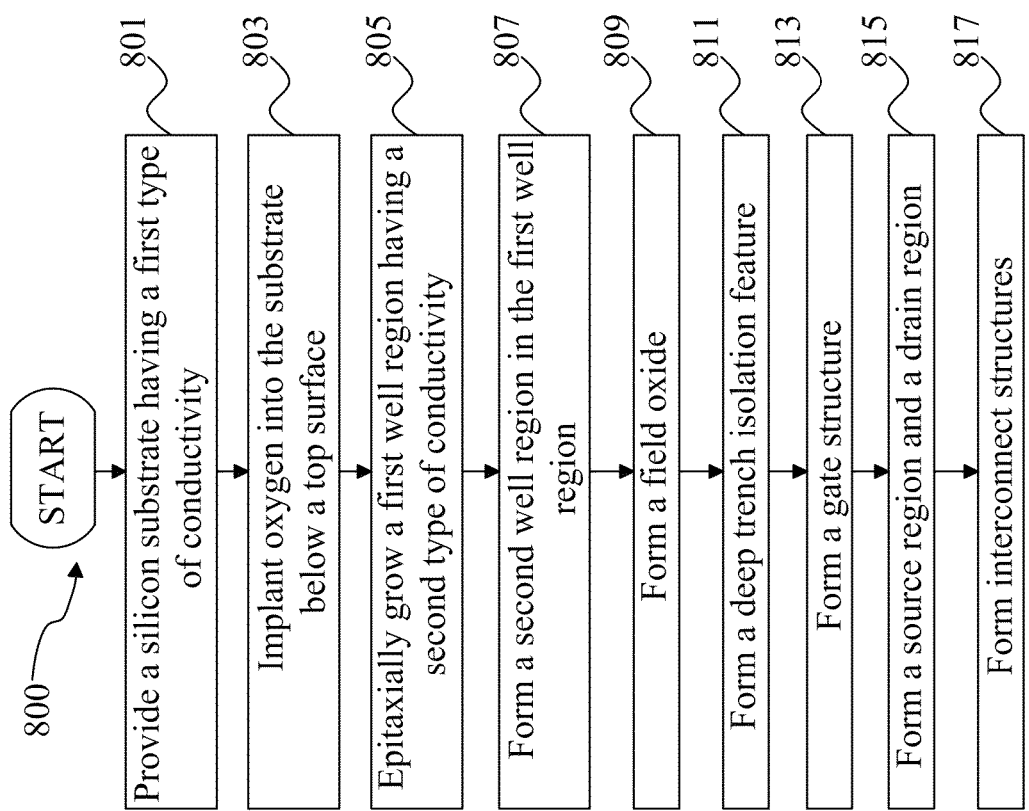
FIG. 8 is a flow chart of a method for fabricating a HV LDMOS device according to various aspects of the present disclosure.

FIG. 8 is a flowchart of a method 800 for fabricating a high voltage laterally diffused MOS semiconductor device, according to various aspects of the present disclosure. It should be noted that the method 800 may be implemented in a complementary metal oxide semiconductor (CMOS) technology process flow. Accordingly, it is understood that additional processes may be provided before, during, and after the method 800, and some processes may only be briefly described herein.

The method 800 begins with block 801 in which a semiconductor substrate is provided. The substrate has a first type of conductivity. For example, as shown in FIG. 9A, the substrate may be p-type as a substrate 901. In various examples, the substrate 901 is a lightly doped silicon. The method 800 continues at block 803 in which oxygen is implanted into the lightly doped semiconductor substrate below a top surface of the substrate. FIG. 9B shows the substrate 901 with an implanted oxygen layer 903 below a top surface of the substrate 901. The substrate 901 is patterned first to protect areas not intended to be exposed to oxygen implantation. Then oxygen is implanted into the substrate at least about 100 nm from the top surface. Relatively high dosage is used to achieve an oxygen peak about 1E21 atoms per cubic centimeter or greater. The top surface remains flat for subsequent epitaxial processes. After implanting, the patterning is removed to result in the workpiece as depicted in FIG. 9B.

In operation 805 of FIG. 8, a first well region is formed having a second type of conductivity, which is different from the first type of conductivity of the substrate. As shown in FIG. 9C, for example, a first well 905 may be an n-well, such as the n-well (N-Drift) formed over the p-substrate 901. The first well 905 may be epitaxially grown over the substrate using epitaxial processes known in the art with in situ doping or a doping step may be later performed using implantation or thermal diffusion methods. For example, the first well 905 may be about 4 micrometers thick, or between about 2 and about 5 micrometers thick.

Figure 9D:
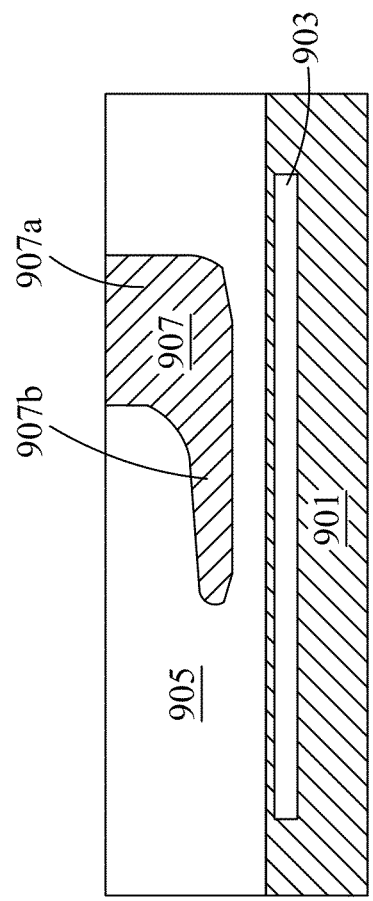

The method 800 continues with block 807 in which a second well region is formed in the first well region. FIG. 9D shows the workpiece after block 807. FIG. 9D shows a second well region 907 in the first well region 905. The second well region 907 may be formed in two operations. A first portion 907a of a second well 907 is formed first in the first well 905. The first portion 907a of the second well 907 starts from a top surface of the first well 905 and extends down in the first well 905. A second portion 907b of the second well 907 is formed in the first well 905; this second portion 907b extends laterally from the first portion 907a beyond the top surface of the first portion 907a of the second well below the top surface of the first well 905. The first and second portions of the second well 907a and 907b have the first type of conductivity. For example, the second well is p-type doped. The first portion and the second portion of the second well 907a and 907b are formed by implanting a p-type dopant using different patterns. Either one may be formed first using a first pattern, then the other may be formed using a second pattern. The implantation uses substantially the same dopant concentrations at different implantation energy levels to achieve varying depths. As shown in FIG. 9D, the resulting second well has a boot shape, but other variations are possible. For example, the second well may be an inverted T.

The method 800 continues with block 809 in which an insulating layer, also referred to as a field oxide, is formed on the workpiece. The field oxide may include a dielectric, such as silicon oxide, nitride, or other suitable insulating materials. FIG. 9E shows an example of a field oxide 909 formed over and in the first well 905 next to but not adjoining second well 907. The field oxide 909 may be formed by a thermal oxide process. The workpiece is patterned to protect regions where the field oxide is undesirable and subjected to a high temperature, for example, about 800 degrees Celsius, in the presence of oxygen.

In the next block 811 of FIG. 8, a deep trench isolation (DTI) feature is formed. In FIG. 9E, a DTI feature 911 laterally surrounds the field oxide 909 and second well 907 in the first well 905 and connects to the implanted oxygen layer 903. The DTI 911 and the implanted oxygen layer 903 surround various elements of the HV LDMOS and isolate these various elements from the substrate and other devices. In some embodiments, the DTI 911 contacts the implanted oxygen layer where oxygen concentration is greater than about 1E20. The DTI feature 911 is formed by etching a deep trench using an etch mask, which may be a photomask or a hardmask, and then filling the deep trench with insulating material. In one example, the insulating material is thermally grown silicon oxide, which is the same material as that of the field oxide. The DTI material may be grown at the same time or at different time from the field oxide 909. In one example, the deep trench is etched first before the field oxide is formed, then the workpiece is repatterned to expose the field oxide region and the trenches. The silicon oxide insulator is grown in the deep trench and over the exposed portions of the first well 905 at the same time. The silicon oxide would fill the deep trenches first and close the opening while the field oxide 909 continues to grow. In another example, a thin layer of thermally grown silicon oxide is formed first on the deep trench sidewalls and bottom, then the deep trench is fill with plasma-assisted deposition process such as high density plasma (HDP) CVD.

Figure 9F:
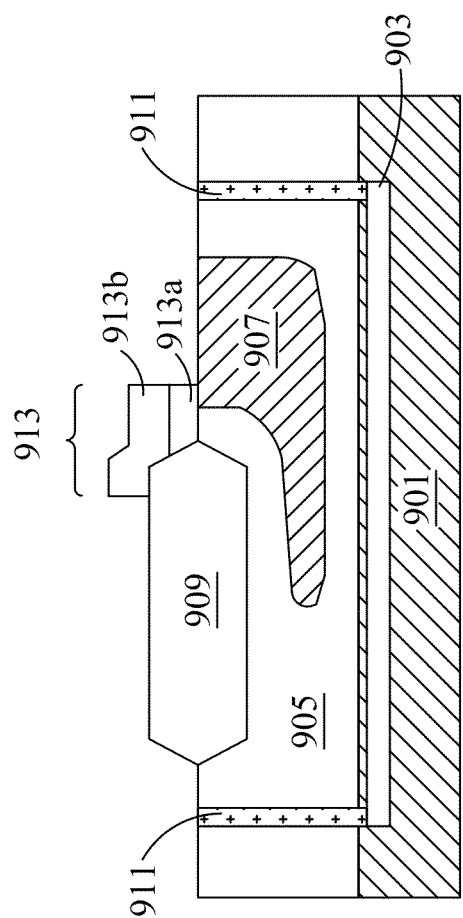

Referring back to FIG. 8, in operation 813, a gate structure is formed over the workpiece. As shown in FIG. 9F, a gate structure 913 has a lower dielectric layer 913a and an upper electrode layer 913b. The gate structure 913 may overlie three areas: a first part of the gate structure 913 overlies an edge of the field oxide 909, a second part of the gate structure overlies the top surface of the first well 905, and the third part of the gate structure overlies the first portion 907a of the second well 907. The precise overlay of the gate structure 913 of the three areas is achieved by a process including photolithography patterning and etching. One exemplary method for patterning the gate dielectric and electrode layers over the three areas is described below. A layer of photoresist is formed on a polysilicon electrode layer by a suitable process, such as spin-on coating, and then patterned to form a patterned photoresist feature by a proper lithography patterning method. The pattern of the photoresist can then be transferred by a dry etching process to the underlying polysilicon electrode layer and the gate dielectric layer to form a gate electrode and a gate dielectric, in a plurality of processing steps and various proper sequences. The precise overlay of the gate structure of the field oxide, the first well, and the second well is controlled by the lithographic alignment procedure. The photoresist layer is stripped thereafter. In another embodiment, only the gate electrode layer is patterned. In another embodiment, a hard mask layer is formed on the polysilicon layer. The patterned photoresist layer is formed on the hard mask layer. The pattern of the photoresist layer is transferred to the hard mask layer and then transferred to the polysilicon layer to form the gate electrode. The hard mask layer may include silicon nitride, silicon oxynitride, silicon carbide, and/or other suitable dielectric materials, and may be formed using a method such as CVD or PVD.

Figure 9G:
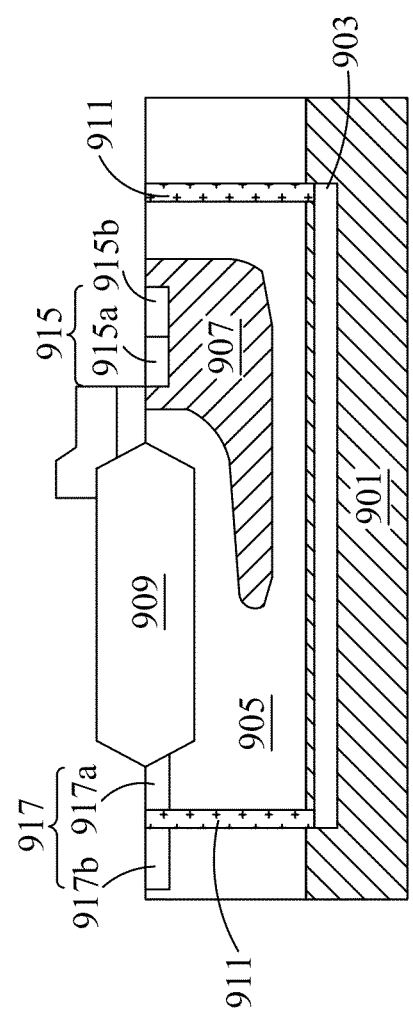

Referring back to FIG. 8, the method 800 continues with block 815, in which a source region and a drain region are formed. As shown in FIG. 9G, a source region 915 includes two regions 915a and 915b. The first source region 915a may have the first type of conductivity; a second source region 915b, formed next to the first source region 915a, may have the second type of conductivity. For example, the first part source is p-type, and the second part source is n-type or vice versa. The drain region 917 includes two regions 917a and 917b. The first drain region 917a may have the first type of conductivity; a second drain region 917b, formed next to the first source region 917a across the DTI feature 911, may have the second type of conductivity. For example, the first part source is p-type, and the second part source is n-type or vice versa. The first and second source and drain regions are formed by implanting n-type or p-type or both types of dopants in each of the regions. Portions of the regions may be implanted at the same time. In one example, regions 917a and 915b are implanted at the same time; and regions 917b and 915a are implanted at the same time. In another example, all of the regions are implanted using one type of dopant and only two regions are implanted using another type of dopant. In still other examples, the regions are implanted at different times.

Figure 9H:
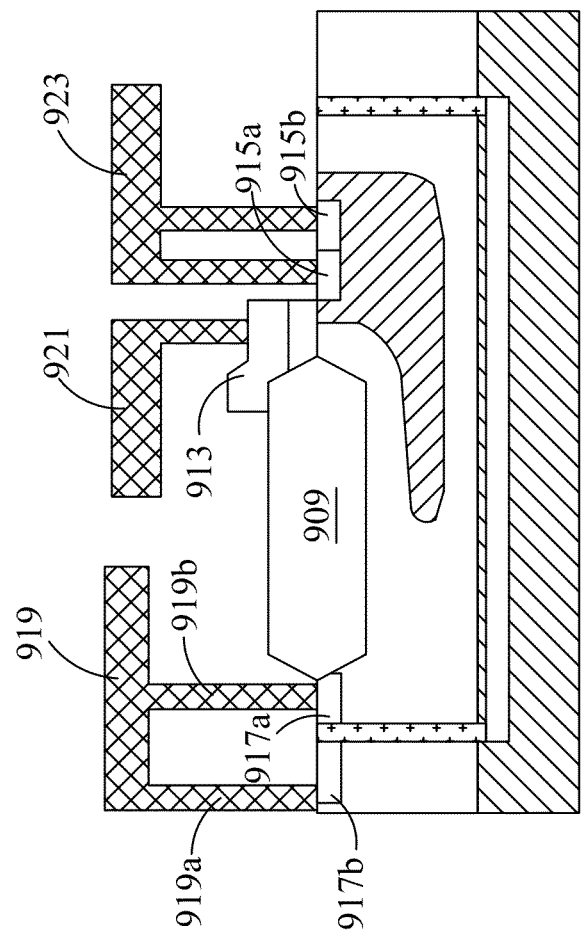

Referring back to FIG. 8, interconnect structures are formed over the transistor. As shown in FIG. 9H, interconnect structures 919, 921, and 923 are formed over various features of the transistor. Note that interconnect structure 919 has two parts, one part connecting to each of the drain structure regions 917a and 917b. Interconnect structure 921 connects to the gate structure 913. Interconnect structure 923 connects to the source regions 915a and 915b singly or together. Each of the interconnect structures 919, 921, and 923 includes a contact portion that directly contacts the transistor element and an interconnect portion above the contact portion. In one embodiment, an interlayer dielectric (ILD) and a multilayer interconnect (MLI) structure are formed in a configuration such that the ILD separates and isolates each metal layer from other metal layers. In furtherance of the example, the MLI structure includes contacts, vias and metal lines formed on the substrate. In one example, the MLI structure may include conductive materials, such as aluminum, aluminum/silicon/copper alloy, titanium, titanium nitride, tungsten, polysilicon, metal silicide, or combinations thereof, being referred to as aluminum interconnects. Aluminum interconnects may be formed by a process including physical vapor deposition (or sputtering), chemical vapor deposition (CVD), or combinations thereof. Other manufacturing techniques to form the aluminum interconnect may include photolithography processing and etching to pattern the conductive materials for vertical connection (via and contact) and horizontal connection (conductive line). Alternatively, a copper multilayer interconnect is used to form the metal patterns. The copper interconnect structure may include copper, copper alloy, titanium, titanium nitride, tantalum, tantalum nitride, tungsten, polysilicon, metal silicide, or combinations thereof. The copper interconnect may be formed by a technique including CVD, sputtering, plating, or other suitable processes.

The ILD material includes silicon oxide. Alternatively or additionally, the ILD includes a material having a low dielectric constant, such as a dielectric constant less than about 3.5. In one embodiment, the dielectric layer includes silicon dioxide, silicon nitride, silicon oxynitride, polyimide, spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. The dielectric layer may be formed by a technique including spin-on, CVD, or other suitable processes.

MLI and ILD structure may be formed in an integrated process such as a damascene process. In a damascene process, a metal such as copper is used as conductive material for interconnection. Another metal or metal alloy may be additionally or alternatively used for various conductive features. Accordingly, silicon oxide, fluorinated silica glass, or low dielectric constant (k) materials can be used for ILD. During the damascene process, a trench is formed in a dielectric layer, and copper is filled in the trench. Chemical mechanical polishing (CMP) technique is implemented afterward to etch back and planarize the substrate surface.

Among various embodiments, the present structure provides an enhanced performing high voltage device, configured as a lateral diffused MOS (HV LDMOS) formed in a dual-well structure (an extended p-type well inside an n-type well) within the substrate and surrounded in an insulating pocket, which reduces substrate leakage current to almost zero. A separate portion of the drain region is outside of the insulating pocket such that the substrate is available for electric potential lines during when a high drain voltage is applied.

An aspect of this description relates to a high voltage semiconductor transistor comprising a lightly doped semiconductor substrate having a first type of conductivity. A portion of the lightly doped semiconductor substrate includes an implanted oxygen layer below a top surface of the lightly doped semiconductor substrate. The high voltage semiconductor transistor also comprises a first well region having a second type of conductivity and formed over the lightly doped semiconductor substrate. The high voltage semiconductor transistor further comprises a second well region in the first well region and having the first type of conductivity. The high voltage semiconductor transistor additionally comprises an insulating structure over and partially embedded in the first well region and not contacting the second well region.

The high voltage semiconductor transistor also comprises a gate structure near the insulating structure over the first well region. The high voltage semiconductor transistor further comprises a drain region in the first well region across the insulating structure from the gate structure. The high voltage semiconductor transistor additionally comprises a source region in the second well region disposed on a side of the gate structure opposite from the drain region. The high voltage semiconductor transistor also comprises a deep trench isolation feature in the first well region surrounding the second well region, the insulating structure, the gate structure, the source region, and a first drain portion, wherein the deep trench isolation feature contacts the implanted oxygen layer.

Another aspect of this description relates to a method for fabricating a high voltage semiconductor transistor comprising implanting oxygen into a lightly doped semiconductor substrate having a first type of conductivity, the oxygen being implanted below a top surface to form an implanted oxygen layer. The method also comprises forming a doped first well region over the substrate, the first well region having a second type of conductivity different from the first type of conductivity. The method further comprises forming a first doped portion of a second well region in the first well region, the first doped portion occupying a region starting from a top surface of the first well region and extending down into the first well region. The method additionally comprises forming a second doped portion of the second well region in the first well region, the second doped portion extending laterally from the first doped portion toward a drain region, and both the first and second portions having the first type of conductivity.

The method also comprises forming an insulating layer on the substrate. The method further comprises forming a gate structure on the substrate, the gate structure having a first part overlying the insulating layer, a second part overlying the first well region, and a third part overlying the first doped portion of the second well region. The method additionally comprises forming a source region in the first doped portion of the second well region on an opposite side of the gate structure from the insulating layer. The method also comprises forming the drain region in the first well region. The method additionally comprises forming a deep trench isolation feature in the substrate and the first well region, wherein the deep trench isolation feature surrounds the second well region, a first portion of the drain region and the insulating layer, and contacts the implanted oxygen layer.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A high voltage semiconductor transistor, comprising:
a lightly doped semiconductor substrate having a first type of conductivity, wherein a portion of the lightly doped semiconductor substrate includes an implanted oxygen layer below a top surface of the lightly doped semiconductor substrate;
a first well region having a second type of conductivity and formed over the lightly doped semiconductor substrate;
a second well region in the first well region and having the first type of conductivity;
an insulating structure over and partially embedded in the first well region and not contacting the second well region;
a gate structure near the insulating structure over the first well region;
a drain region in the first well region across the insulating structure from the gate structure, wherein the drain region comprises a first drain portion and a second drain portion;
a source region in the second well region disposed on a side of the gate structure opposite from the drain region; and
a deep trench isolation feature in the first well region, the deep trench isolation feature surrounding the second well region, the insulating structure, the gate structure, the source region, and the first drain portion, wherein a portion of the deep trench isolation feature is closer to the drain region than the source region, wherein the first drain portion is separated from the second drain portion by the deep trench isolation feature and,
wherein the deep trench isolation feature contacts the implanted oxygen layer.

2. The high voltage semiconductor transistor of claim 1, wherein the implanted oxygen layer has a peak oxygen concentration at about 300 nm from the top surface of the lightly doped semiconductor substrate.

3. The high voltage semiconductor transistor of claim 1, wherein the implanted oxygen layer includes oxygen concentration above about 5E20 atoms/cm$^3$ and is about 100 nm thick.

4. The high voltage semiconductor transistor of claim 1, wherein the implanted oxygen layer is at least 100 nm below the top surface of the lightly doped semiconductor substrate.

5. The high voltage semiconductor transistor of claim 1, wherein the drain region comprises the first drain portion and a second drain portion, the first drain portion is adjacent to the insulating structure and the second drain portion further away from the insulating structure.

6. The high voltage semiconductor transistor of claim 1, wherein the source region comprising a first region having the first type of conductivity and a second region having the second type of conductivity.

7. The high voltage semiconductor transistor of claim 1, wherein the deep trench isolation feature contacts the implanted oxygen layer where oxygen concentration is greater than about 1E20 atoms/cm$^3$.

8. The high voltage semiconductor transistor of claim 1, wherein the deep trench isolation feature comprises thermally grown silicon oxide.

9. The high voltage semiconductor transistor of claim 1, wherein the deep trench isolation feature is at least 100 nm wide.

10. The high voltage semiconductor transistor of claim 1, wherein the second well region comprises a first portion and a second portion, the first portion surrounding the source region and the second portion extending laterally under the gate structure.

11. The high voltage semiconductor transistor of claim 1, wherein the gate structure comprises a gate electrode, the gate electrode comprising Al, Cu, W, Ti, Ta, TiN, TaN, NiSi, CoSi, or a combination thereof.

12. The high voltage semiconductor transistor of claim 1, wherein the gate structure comprises a gate dielectric, the gate dielectric comprising silicon oxide, a high-K dielectric material, or silicon oxynitride.

13. The high voltage semiconductor transistor of claim 1, the gate structure being formed partly on the insulating structure.

14. A high voltage semiconductor transistor, comprising:
a semiconductor substrate having an implanted oxygen layer below a top surface of the semiconductor substrate;
a first well region over the semiconductor substrate;
a second well region in the first well region;
an insulating structure over and partially embedded in the first well region, the insulating structure isolated from contact with the second well region;
a gate structure near the insulating structure over the first well region;
a drain region in the first well region across the insulating structure from the gate structure, wherein the drain region comprises a first drain portion adjacent to the insulating structure and a second drain portion farther away from the insulating structure;
a source region in the second well region disposed on a side of the gate structure opposite the drain region; and
a deep trench isolation feature in the first well region, the deep trench isolation feature being in contact with the implanted oxygen layer,
wherein the first drain portion is separated from the second drain portion by a portion of the deep trench isolation feature, and
wherein the deep trench isolation feature and the implanted oxygen layer together surround the second well region, the insulating structure, the gate structure, the source region, and the first drain portion.

15. The high voltage semiconductor transistor of claim 14, wherein the gate structure is partly on the insulating structure.

16. The high voltage semiconductor transistor of claim 14, wherein the implanted oxygen layer includes oxygen concentration above about 5E20 atoms/cm$^3$ and is about 100 nm thick.

17. The high voltage semiconductor transistor of claim 14, wherein the implanted oxygen layer is at least 100 nm below the top surface of the semiconductor substrate.

18. The high voltage semiconductor transistor of claim 14, wherein the deep trench isolation feature and the implanted oxygen layer together do not surround the second drain portion.

19. The high voltage semiconductor transistor of claim 14, wherein the source region comprises a first region having a first type of conductivity and a second region having a second type of conductivity.

20. The high voltage semiconductor transistor of claim 14, wherein the second well region comprises a first portion and a second portion, the first portion surrounds the source region and the second portion extends laterally under the gate structure.

* * * * *